US011512385B2

(12) United States Patent
Olson et al.

(10) Patent No.: US 11,512,385 B2
(45) Date of Patent: Nov. 29, 2022

(54) METHOD OF FORMING GRATINGS

(71) Applicant: Applied Materials, Inc., Santa Clara, CA (US)

(72) Inventors: Joseph C. Olson, Beverly, MA (US); Ludovic Godet, Sunnyvale, CA (US); Rutger Meyer Timmerman Thijssen, San Jose, CA (US); Morgan Evans, Manchester, MA (US); Jinxin Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 381 days.

(21) Appl. No.: 16/715,906

(22) Filed: Dec. 16, 2019

(65) Prior Publication Data

US 2020/0192010 A1 Jun. 18, 2020

Related U.S. Application Data

(60) Provisional application No. 62/780,792, filed on Dec. 17, 2018.

(51) Int. Cl.
*G03F 7/20* (2006.01)
*C23C 14/22* (2006.01)
*G02B 5/18* (2006.01)
*G03F 7/00* (2006.01)
*G03F 7/16* (2006.01)
*F21V 8/00* (2006.01)

(52) U.S. Cl.
CPC .......... *C23C 14/221* (2013.01); *G02B 5/1857* (2013.01); *G03F 7/001* (2013.01); *G03F 7/16* (2013.01); *G03F 7/2002* (2013.01); *G02B 6/0016* (2013.01); *G02B 6/0065* (2013.01)

(58) Field of Classification Search
CPC ...... G03F 7/201; G03F 7/2059; G03F 7/2051; G03F 7/213; G03F 7/26
See application file for complete search history.

(56) References Cited

U.S. PATENT DOCUMENTS

2006/0001520 A1* 1/2006 Kaji ................ H01L 28/10
257/E21.022
2006/0157341 A1 7/2006 Fujii
2015/0048047 A1 2/2015 Liu et al.
(Continued)

FOREIGN PATENT DOCUMENTS

WO 2013120428 A1 8/2013

OTHER PUBLICATIONS

International Search Report/ Written Opion issued to PCT/US2019/066599 dated Apr. 16, 2020.

*Primary Examiner* — Daborah Chacko-Davis
(74) *Attorney, Agent, or Firm* — Patterson + Sheridan, LLP

(57) ABSTRACT

Embodiments of the disclosure generally relate to methods of forming gratings. The method includes depositing a resist material on a grating material disposed over a substrate, patterning the resist material into a resist layer, projecting a first ion beam to the first device area to form a first plurality of gratings, and projecting a second ion beam to the second device area to form a second plurality of gratings. Using a patterned resist layer allows for projecting an ion beam over a large area, which is often easier than focusing the ion beam in a specific area.

20 Claims, 9 Drawing Sheets

(56) References Cited

U.S. PATENT DOCUMENTS

2016/0033784 A1\* 2/2016 Levola ................ G02B 5/1857
385/37
2016/0035539 A1 2/2016 Sainiemi et al.
2018/0095201 A1 4/2018 Meili et al.

\* cited by examiner

METHOD OF FORMING GRATINGS

CROSS-REFERENCE TO RELATED APPLICATIONS

This application claims priority to U.S. Provisional Patent Application No. 62/780,792, filed Dec. 17, 2018, which is hereby incorporated by reference in its entirety.

BACKGROUND

Field

Embodiments of the present disclosure generally relate to a method and, more specifically, to a method of forming gratings.

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences.

A virtual image is overlaid on an ambient environment to provide an augmented reality experience to the user. Waveguides are used to assist in overlaying images. Generated light is propagated through a waveguide until the light exits the waveguide and is overlaid on the ambient environment. Optical devices generally need multiple waveguides with different physical properties on the same substrate in order to guide light of different wavelengths.

One drawback in the art is that manufacturing waveguides on the same substrate is a time-consuming process. Different mask steps and methods are needed in photolithography in order to manufacture waveguides with different material properties. In addition, some photolithography methods do not have the capability to make varying spacing and profiles of gratings in the different waveguides.

Therefore, what is needed is a manufacturing process that allows formation of grating regions with different grating profiles.

SUMMARY

Embodiments of the disclosure generally relate to methods of forming gratings. A resist layer is disposed over grating material and patterned, allowing for more accurate formation of gratings with desired grating profiles.

In one embodiment, a method of forming gratings is provided. The method includes depositing a resist material on a grating material disposed over a substrate, patterning the resist material into a resist layer, projecting a first ion beam to the first device area for a first period of time to form a first plurality of gratings in the grating material, and projecting a second ion beam to the second device area for a second period of time to form a second plurality of gratings in the grating material. The resist material has a first and second device area. The first ion beam has a first angle to a surface of the substrate and a first ion beam profile. The second ion beam has a second angle to the surface of the substrate and a second ion beam profile. At least one of the first ion beam profile and the second ion beam profile is not uniform.

In another embodiment, a method of forming gratings is provided. The method includes depositing a resist material on a grating material disposed over a substrate, patterning the resist material into a resist layer, projecting a first ion beam to the first device area for a first period of time to form a first plurality of gratings in the grating material, and projecting a second ion beam to the second device area for a second period of time to form a second plurality of gratings in the grating material. The resist material has a first and second device area. The first ion beam has a first angle to a surface of the substrate and a first ion beam profile. The second ion beam has a second angle to the surface of the substrate and a second ion beam profile. The patterning comprises pressing a mask against the resist material. At least one of the first ion beam profile and the second ion beam profile is not uniform.

In yet another embodiment, a method of forming gratings is provided. The method includes depositing a resist material on a grating material disposed over a substrate, patterning the resist material into a resist layer, projecting a first ion beam to the first device area for a first period of time to form a first plurality of gratings in the grating material, and projecting a second ion beam to the second device area for a second period of time to form a second plurality of gratings in the grating material. The resist material has a first and second device area. The first ion beam has a first angle to a surface of the substrate and a first ion beam profile. The second ion beam has a second angle to the surface of the substrate and a second ion beam profile. The resist layer has a first pattern and a second pattern. The first pattern contains a first plurality of pattern features with the first angle to a surface of the first pattern. The second pattern contains a second plurality of pattern features with the second angle to the surface of the first pattern. At least one of the first ion beam profile and the second ion beam profile is not uniform.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to methods of forming gratings. The method includes depositing a resist material on a grating material disposed over a substrate, patterning the resist material into a resist layer, projecting a first ion beam to the first device area to form a first plurality of gratings, and projecting a second ion beam to the second device area to form a second plurality of gratings. Using a patterned resist layer allows for projecting an ion beam over a large area, which is often easier than focusing the ion beam in a specific area. The angles of elements of the patterned resist facilitates ion etching for angles of the ion beam that are similar to angles of the elements of the patterned resist layer. Other regions are less patterned, due to the mismatch of the angles of the ion beam to the angles of the elements of the patterned resist layer. Elements of the disclosure may be useful for, but not limited to, forming gratings with desired profiles at certain portions of a substrate.

As used herein, the term "about" refers to a +/−10% variation from the nominal value. It is to be understood that such a variation can be included in any value provided herein.

Figure 1A:
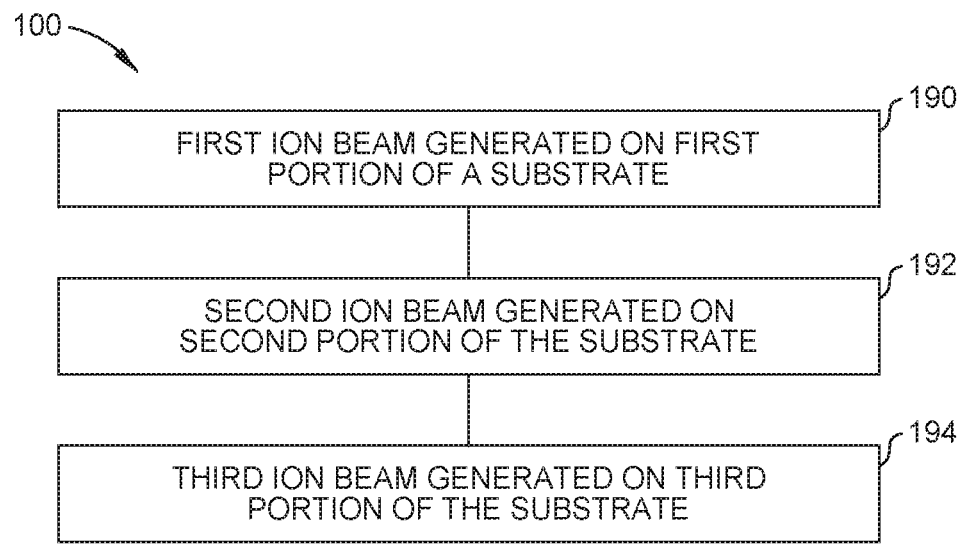
FIG. 1A is a flow diagram of method operations for forming gratings, according to one embodiment.

FIG. 1A is a flow diagram of method 100 operations for forming gratings, or fins, according to one embodiment. Although the method 100 operations are described in conjunction with FIGS. 1A-1D, persons skilled in the art will understand that any system configured to perform the method operations, in any order, falls within the scope of the embodiments described herein.

The method 100 begins at operation 190, where a first ion beam is projected onto a first portion of a substrate. The first ion beam is created by an ion source. The substrate is configured to be used in an optical device. The substrate can be glass, plastic, polycarbonate materials, or any substrate used in the art. For example, the substrate includes a semiconducting material, e.g., silicon (Si), germanium (Ge), silicon germanium (SiGe), and/or a III-V semiconductor such as gallium arsenide (GaAs). In another example, the substrate 101 includes a transparent material, (e.g., glass, plastic, and/or polycarbonate). The substrate can have any number of insulating, semiconducting, or metallic layers thereon.

Figure 1B:
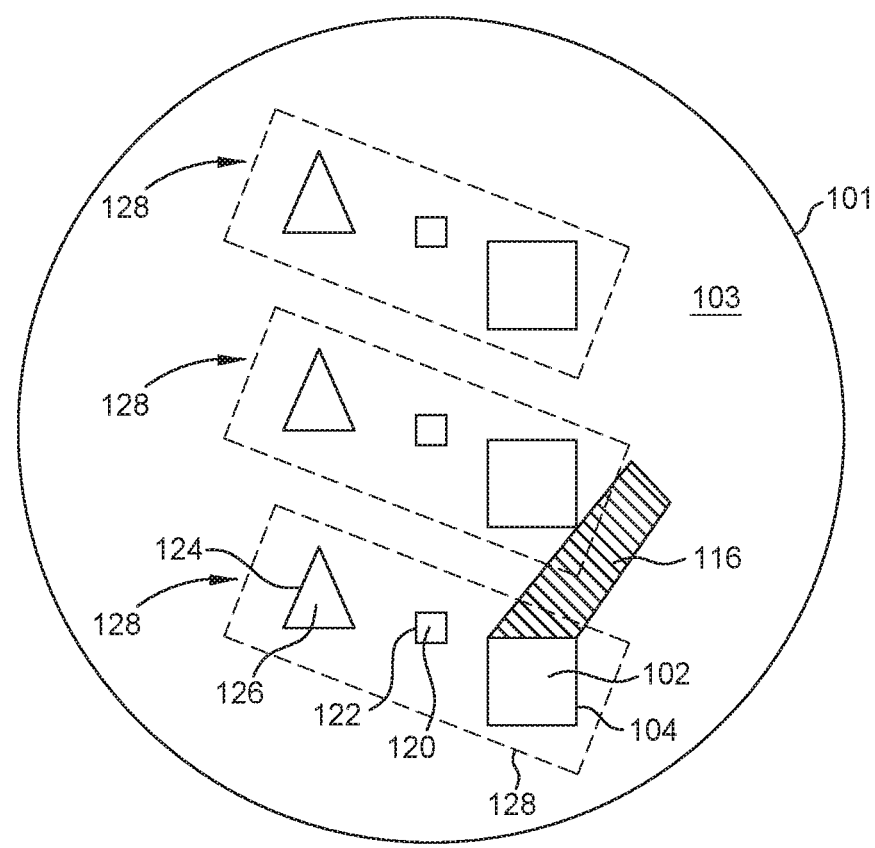
FIG. 1B illustrates an ion beam incident on a substrate, according to one embodiment.

FIG. 1B illustrates an ion beam 116 incident on a substrate 101, according to one embodiment. The ion beam has a first beam area corresponding to a first device area 102 disposed over the substrate 101. The first device area 102 corresponds to each first device of a plurality of first devices 104 to be formed in a grating material 103 disposed on the substrate 101. The first ion beam is projected to the first device area 102 having an ion beam profile.

The ion beam profile can have a cross-sectional pattern with different ion beam intensities and/or ion beam concentrations in different portions of the pattern. When the ion beam having a specific pattern is projected onto a material (e.g., the grating material 103), different portions of the material is etched at different depths, depending on the intensity of the ion beam cross-sectional pattern projected onto the portion of the material. For example, a first portion of the pattern with a high ion beam intensity projected onto a first portion of the material results in a deep etch of the first portion. A second portion of the pattern with a lower ion beam intensity projected onto a second portion of the material results in a shallower etch of the second portion. Thus, a desired etch profile can be formed in the material by a corresponding ion beam profile.

The grating material 103 can include silicon oxycarbide (SiOC), titanium oxide (TiO$_x$), TiO$_x$ nanomaterials, niobium oxide (NbO$_x$), niobium-germanium (Nb$_3$Ge), silicon dioxide (SiO$_2$), silicon oxycarbonitride (SiOCN), vanadium (IV) oxide (VO$_x$), aluminum oxide (Al$_2$O$_3$), indium tin oxide [InTiO] (ITO), zinc oxide (ZnO), tantalum pentoxide (Ta$_2$O$_5$), silicon nitride (Si$_3$N$_4$), silicon-rich Si$_x$N$_y$, hydrogen-doped Si$_3$N$_4$, boron-doped Si$_3$N$_4$, silicon carbon nitrate (SiCN), titanium nitride (TiN), zirconium dioxide (ZrO$_2$), germanium (Ge), gallium phosphide (GaP), poly-crystalline (PCD), nanocrystalline diamond (NCD), doped diamond containing materials, or any combination of the above.

Figure 1C:
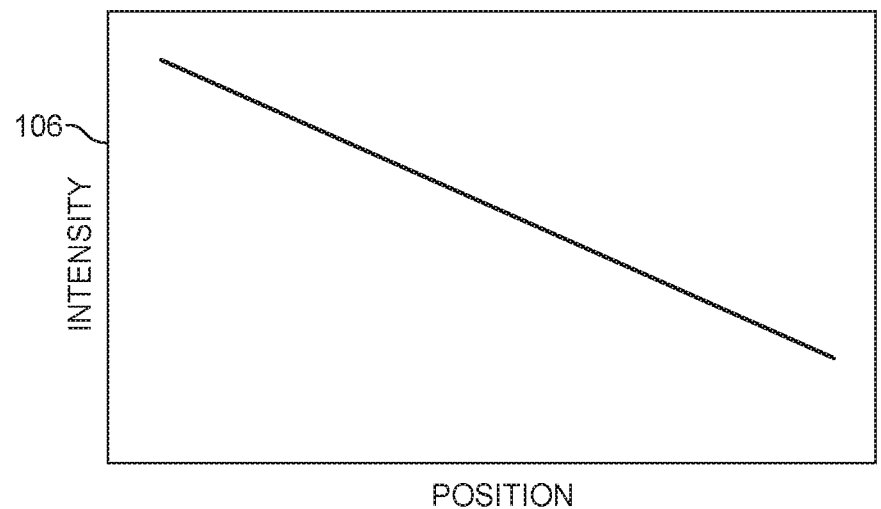
FIG. 1C illustrates an ion beam profile of an ion beam, according to one embodiment.

FIG. 1C illustrates the ion beam profile 106 of the ion beam 116, according to one embodiment. As shown, the intensity of the ion beam profile 106 varies with the position within the cross-section of the ion beam 116. Thus, the depth of the gratings created by the ion beam is variable. Although the ion beam profile illustrated in FIG. 1C is linear, other variations of the ion beam profile are contemplated. In some embodiments, the ion beam profile 106 is uniform, i.e., the intensity is uniform across the entire ion beam profile 106. In some embodiments, the ion beam profile 106 is not uniform, i.e., the intensity is not uniform across the entire ion beam profile 106. The ion beam profile can also be a two-dimensional (2D) pattern.

Figure 1D:
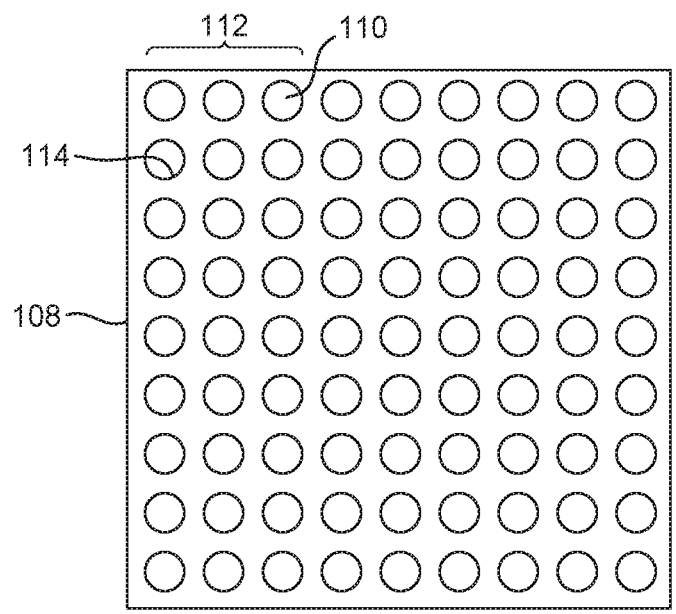
FIG. 1D illustrates a plate having a plurality of filters, according to one embodiment.

In one embodiment, which can be combined with other embodiments described herein, the ion beam profile 106 of the first ion beam is provided by filtering ions of the first ion beam with a plate having a plurality of filters. FIG. 1D illustrates a plate 108 having a plurality of filters 110, according to one embodiment. The plate 108 is configured to interface with and couple to the ion source to modulate the intensity or distribution of the ion beam passing through the plate 108. The plurality of filters 110 includes portions 112 having the same or different diameters 114. The plurality of filters 110 can include holes, or openings, which allow ions of a desired intensity and/or density to pass therethrough. The plate 108 is fabricated from a material of sufficient thickness which is resistant or inert to ion beam bombardment and prevents ions from passing therethrough. The plurality of filters 110 extend through the plate 108 to form openings through which the ion beam passes. The plurality of filters 110 are illustrated as being substantially circle-shaped with an approximately even distribution between adjacent filters of the first plurality of filters. However, any number, shape, orientation, spacing, or arrangement of the plurality of filters 110 can be utilized to modulate the intensity or distribution of the ion beam passing therethrough to create the desired ion beam profile.

In another embodiment, which can be combined with other embodiments described herein, the ion beam profile 106 is provided by changing to a plasma profile of the first ion beam. The first device area 102 is exposed to the first ion beam for a first period of time to form a first plurality of gratings of the first device 104. The substrate 101 is repeatedly moved, i.e., stepped, such that each first device area 102 is exposed to the first ion beam 116 with the ion beam profile 106.

At operation 192, a second ion beam is projected onto a second portion of a substrate. Referring to FIG. 1B, the second portion includes a second device area 120 of the substrate 101, according to one embodiment. The second ion beam has a second beam area corresponding to the second device area 120. The second device area 120 corresponds to each second device of a plurality of second devices 122 to be formed in the grating material 103. The second ion beam is projected to the second device area 120 with a ion beam profile 106 as described herein. The ion beam profile of the second ion beam can be different or the same as the ion beam profile of the first ion beam. The second device area 120 is exposed to the second ion beam for a second period of time to form a second plurality of gratings of the second device 122. The first period of time may partially overlap with the second period of time, and thus a portion of operation 190 may overlap with operation 192, according to one embodiment. The substrate 101 is repeatedly moved, i.e., stepped, such that each second device area 120 is exposed to the second ion beam with the ion beam profile.

At operation 194, a third ion beam is projected onto a third portion of a substrate. The third portion includes a third device area 124 of the substrate 101, according to one embodiment. The third ion beam has a third beam area corresponding to the third device area 124. The third device area 124 corresponds to each third device of a plurality of third devices 126 to be formed in the grating material 103. The third ion beam is projected to the third device area 124 with a ion beam profile 106 as described herein. The ion beam profile of the third ion beam can be different or the same as the ion beam profile of the first and/or ion beam. The third device area 124 is exposed to the third ion beam for a third period of time to form a third plurality of gratings of the second device 122. The substrate 101 is repeatedly moved, i.e., stepped, such that each third device area 124 is exposed to the third ion beam with the ion beam profile. In some embodiments, at least one of the first ion beam profile, the second ion beam profile, and the third ion beam profile is not uniform.

The first period of time may partially overlap with the third period of time, and thus at least a portion of operation 190 may overlap with operation 194, according to one embodiment. The second period of time may partially overlap with the third period of time, and thus a portion of operation 192 may overlap with operation 194, according to one embodiment. The first period of time may partially overlap with the second period of time and the third period of time, and thus a portion of operation 190 may overlap with operations 192, 194, according to one embodiment.

Figure 2A:
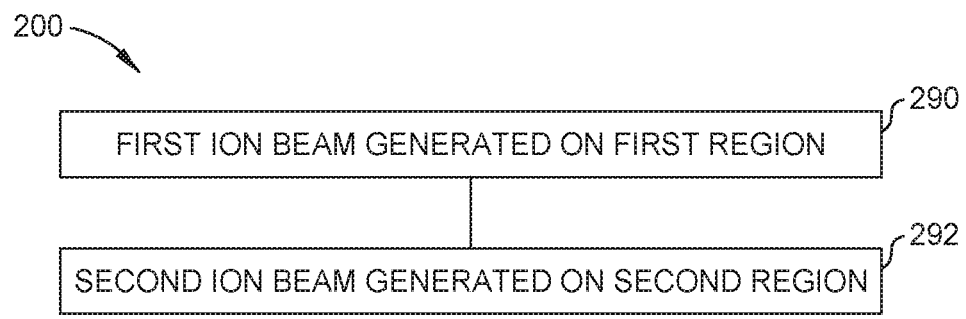
FIG. 2A is a flow diagram of method operations for forming gratings, according to one embodiment.

FIG. 2A is a flow diagram of method 200 operations for forming gratings, according to one embodiment. Although the method 200 operations are described in conjunction with FIGS. 2A-2E, persons skilled in the art will understand that any system configured to perform the method operations, in any order, falls within the scope of the embodiments described herein.

Figure 2B:
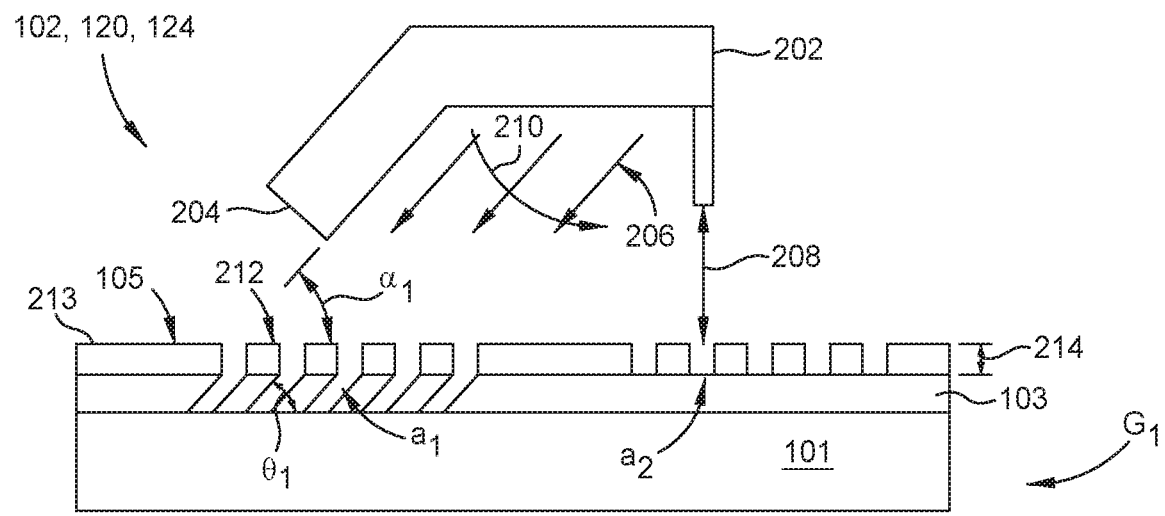
FIG. 2B illustrates an ion beam incident on a first region of a substrate, according to one embodiment.

The method 200 begins at operation 290, where a first portion of a substrate is exposed to an ion beam from an ion source. FIG. 2B illustrates an ion beam 206 incident on a first region $a_1$ of the substrate 101, according to one embodiment. An ion source 202 projects the ion beam 206 to the first region $a_1$. The ion source 202 has a plurality of angled segments 204 configured to project the ion beams 206 generated by the ion source to the substrate 101, i.e., the ion source 202 is a segmented ion source. The ion beams 206 projected to the substrate 101 have at least one beam angle $\alpha_1$ relative to a surface 105 of the substrate 101. The angled segments 204 can be localized to regions of waveguide combiners fabricated by the method 100, for example, the first device areas 102, the second device areas 120, and the third device areas 124. The substrate 101 is disposed in a first position G1. A first plurality of gratings 212 is formed from, or in, the grating material 103. The first plurality of gratings 212 have a slant angle $\vartheta_1$ that is defined between a first direction parallel to the surface 105 and a second direction perpendicular to the surface. The slant angle $\vartheta_1$ is about equal to the beam angle $\alpha_1$. The slant angle $\vartheta_1$ and/or beam angle $\alpha_1$ can vary from about 5° to about 175°.

To form a plurality of gratings, a patterned hardmask 213 is disposed over the grating material 103. The ion beam 206 contacts exposed portions of the grating material and etches gratings in the grating material 103. In some embodiments, which can be combined with other embodiments described herein, the ion beams 206 projected to the substrate 101 have a plurality of different beam angles $\alpha$ corresponding to a rolling k-vector 210 such that portions of a plurality of gratings have different slant angles $\vartheta$ relative to the surface normal 105.

Figure 2C:
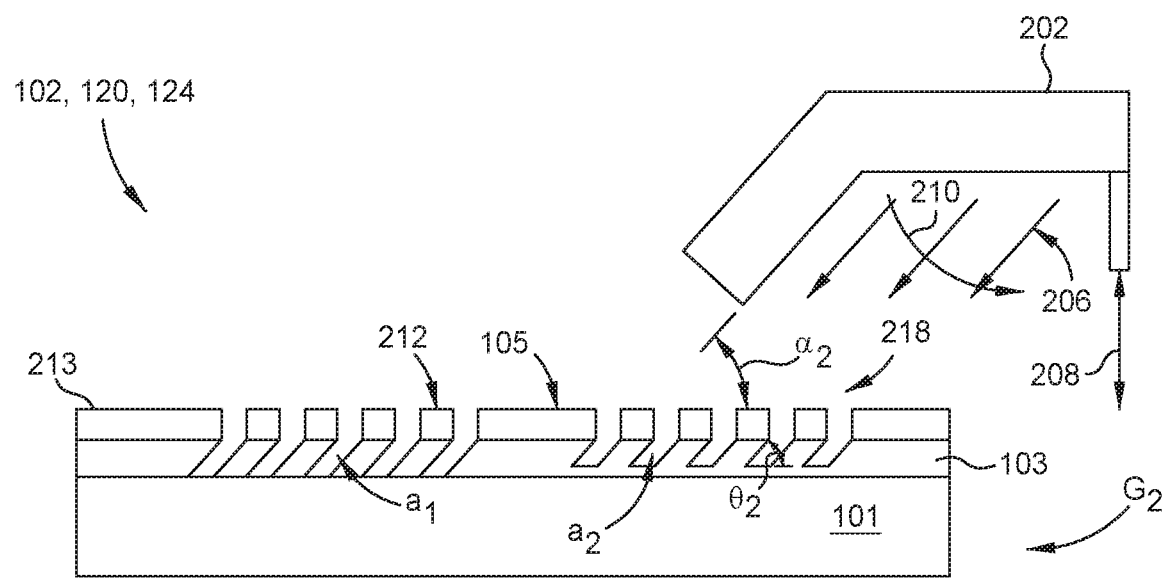
FIG. 2C illustrates an ion beam incident on a second region of a substrate, according to one embodiment.

At operation 292, a second portion of the substrate is exposed to an ion beam from an ion source. FIG. 2C illustrates an ion beam 206 incident on a second portion $a_2$ of the substrate 101, according to one embodiment. In some embodiments, which can be combined with other embodiments described herein, a vertical distance 208 of the substrate 101 from the segmented ion source 202 changes. For example, the substrate 101 can be moved by a pedestal (not shown) disposed under the substrate 101. In another example, the ion source 202 is moved in a vertical direction (e.g., perpendicular to the surface of the substrate 101), and/or in a horizontal direction (e.g., parallel to the surface of the substrate 101). The ion source 202 is moved from the first position G1, where the first portion $a_1$ of the grating material 103 is exposed, to a second position G2, where the second portion $a_2$ of the grating material is exposed.

A second plurality of gratings 218 is formed from, or in, the grating material 103. The second plurality of gratings 218 has a slant angle $\vartheta_1$ that is defined between the first direction parallel to the surface 105 and the second direction perpendicular to the surface. The slant angle $\vartheta_2$ is about equal to the beam angle $\alpha_2$. The slant angle $\vartheta_2$ and/or beam angle $\alpha_1$ can vary from about 5° to about 175°. The first slant angle $\vartheta_1$ is from about 5° to about 85°, and the second slant angle $\vartheta_2$ is from about 95° to about 175°, according to one embodiment.

Figure 2D:
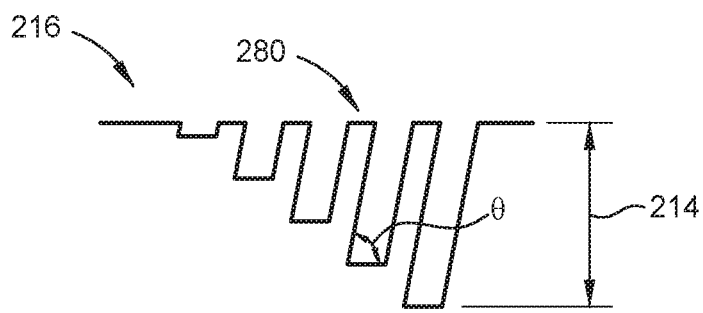
FIG. 2D illustrates a plurality of gratings with a sloped profile, according to one embodiment.

A profile for a plurality of gratings includes the variance in depths between individual grating elements, the variance in angles between individual grating elements, and the rate of change of the angles and/or depths between individual grating elements. FIG. 2D illustrates a plurality of gratings 280 with a sloped profile 216, according to one embodiment. Smoothly scanning the substrate 101 from the first position G1 to the second position G2 can form a plurality of gratings 280 with a plurality of depths 214 having the sloped profile 216. The ion beam profile 106 of the ion beam 206 also can create a profile in the plurality of gratings. Either, or both, of the first or second plurality of gratings 212, 218 can have the sloped profile 216.

Figure 2E:
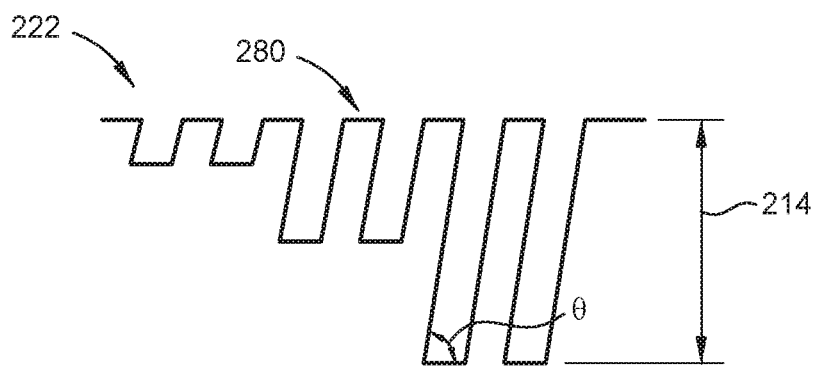
FIG. 2E illustrates a plurality of gratings with a stepped profile, according to one embodiment.

FIG. 2E illustrates a plurality of gratings 280 with a stepped profile 222, according to one embodiment. Stepping the substrate 101 from the first position G1 to the second position G2 form the plurality of gratings 280 with a plurality of depths 214 having the stepped profile 222. The ion beam profile 106 of the ion beam 206 also can create a profile in the plurality of gratings. Either, or both, of the first or second plurality of gratings 212, 218 can have the stepped profile 222.

In one embodiment, the first plurality of gratings 212 has a sloped profile 216. In one embodiment, the first plurality of gratings 212 has a stepped profile 222. In one embodiment, the first plurality of gratings 212 has a first profile, and the second plurality of gratings 218 has a different profile.

Referring to FIG. 2B, in one embodiment, the patterned hardmask 213 has a thickness that filters ion beams 206 having the plurality of different beam angles α such that each of the plurality of gratings 212, 218 have the same slant angles $\vartheta_1$, $\vartheta_2$. In another embodiment, at least one of the gratings in one or more of the plurality of gratings 212, 218 has a different slant angle $\vartheta_1$, $\vartheta_2$ than one of the other gratings in the same plurality of gratings. In some embodiments, at least one of the first ion beam profile and the second ion beam profile is not uniform.

Figure 3A:
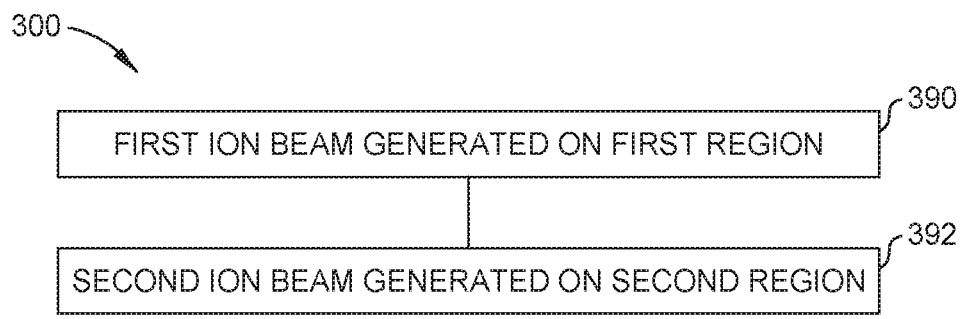
FIG. 3A is a flow diagram of method operations for forming gratings, according to one embodiment.

FIG. 3A is a flow diagram of method 300 operations for forming gratings, according to one embodiment. Although the method 300 operations are described in conjunction with FIGS. 3A-3C, persons skilled in the art will understand that any system configured to perform the method operations, in any order, falls within the scope of the embodiments described herein.

Figure 3B:
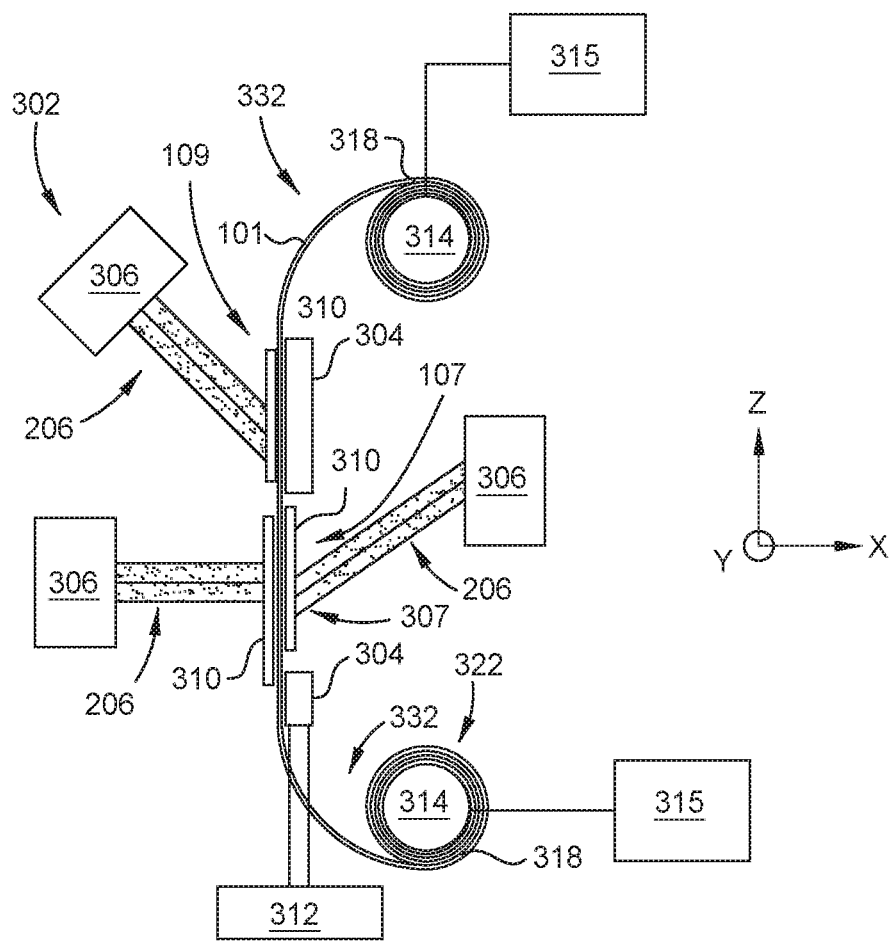
FIGS. 3B-3C illustrate an angled etch system, according to one embodiment.

The method 300 begins at operation 390, where a first portion of a flexible substrate is exposed to an ion beam with a first ion beam profile. FIG. 3B illustrates an angled etch system 302, according to one embodiment. The angled etch system 302 is configured expose ion beams 206 at different angles onto the substrate 101. As shown, the angled etch system 302 includes a pedestal 304, a plurality of ion beam chambers 306, a scanner 312, and a rolling system 322.

The pedestal 304 retains the substrate 101 such that a first surface 107 of the substrate 101 is exposed to ion beams 206 generated by one or more ion beam chambers 306 oriented toward the first surface 107. The pedestal 304 has one or more holes 307 to allow one or more ion beam 206 to pass therethrough and form one more devices 310 on the first surface 107. A second surface 109 of the substrate 101 is exposed to the one or more ion beams 206 generated by the one or more ion beam chambers 306 oriented toward the second surface 109. The first surface 107 and the second surface 109 are exposed to the ion beam 206 to form devices 310 on the first surface 107 and the second surface 109. Thus, the angled etch system 302 is configured to create one or more devices 310 on both surfaces 107, 109 of the substrate 101.

Each of the devices 310 has a plurality of gratings having slant angles (e.g., the plurality of gratings 212, 218). The angled etch system 302 can include the scanner 312 operable to move the pedestal 304 along at least one of a y-direction and an x-direction.

The substrate 101 has rollable and flexible properties such that the rolling system 322 is configured to position a first segment 316 of the substrate 101 in the path of the ion beam 206 to form the devices 310. As shown, the rolling system 322 includes a plurality of rollers 314 and a plurality of roller actuators 315. The rollers 314 rotate rolled portions 318 of the flexible substrate 101, so that additional portions 332 of the substrate can be exposed to the plurality of ion beam chambers. Each of the roller actuators 315 are configured to rotate one of the plurality of rollers 314 to expose different portions of the substrate 101 to the ion beam chambers 306.

Figure 3C:
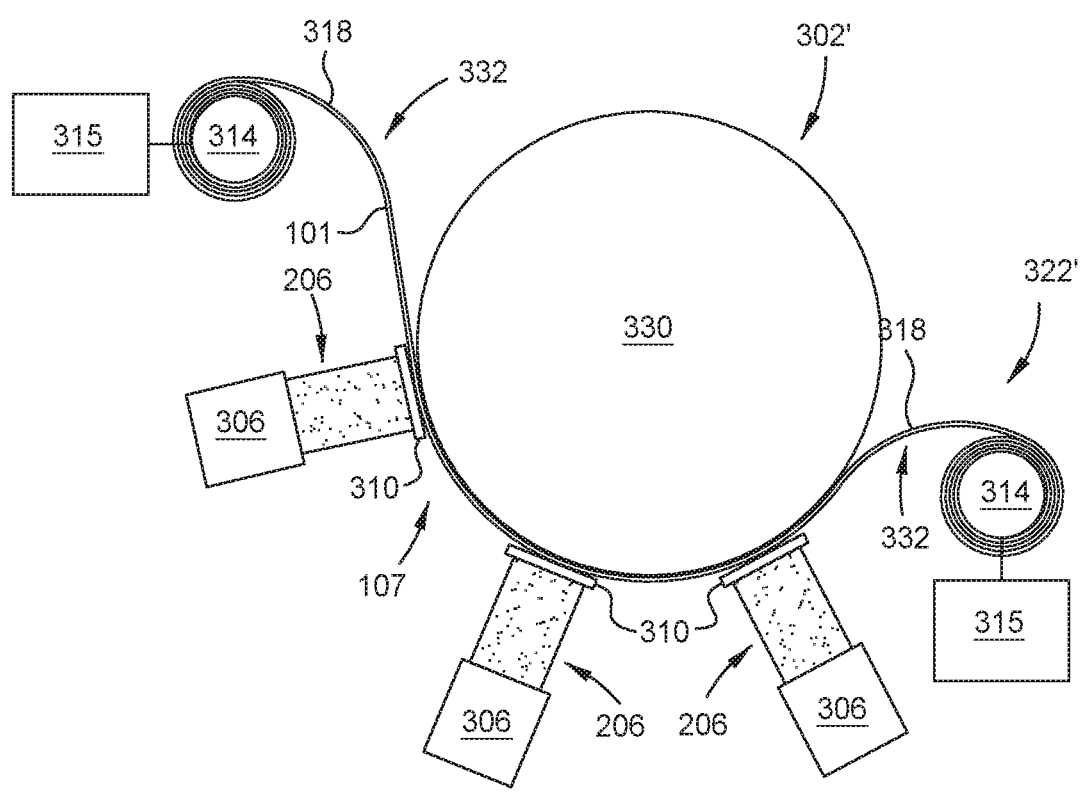

FIG. 3C illustrates an angled etch system 302', according to one embodiment. As shown, the angled etch system 302' includes a rolling system 322' and one or more ion beam chambers 306. In this embodiment, the ion beam chambers 306 are located on the same side 107 of the substrate 101. As shown, the angled etch system 322' includes a stabilizing member 330, a plurality of rollers 314, and a plurality of roller actuators 315. The rollers 314 rotate rolled portions 318 of the flexible substrate 101, so that additional portions 332 of the substrate can be exposed to the plurality of ion beam chambers. The substrate 101 is rolled along the supporting member 330. Each of the roller actuators 315 are configured to rotate one of the plurality of rollers 314 to expose different portions of the substrate 101 to the ion beam chambers 306.

At operation 392, a second portion of the flexible substrate is exposed to an ion beam with a second ion beam profile. The first and second ion beam profiles can be the same or different. In some embodiments, at least one of the first ion beam profile and the second ion beam profile is not uniform. After the devices 310 are formed on the first segment 316, additional portions 332 of the substrate 101 are exposed to the plurality of ion beam chambers. For example, the rolling system 322, 322' advance the additional portions 332 of the substrate 101 to be exposed to the plurality of ion beam chambers 306.

In addition, the angled etch systems 302, 302' can be used in any of the methods 100, 200, 300, 400 disclosed herein.

Figure 4A:
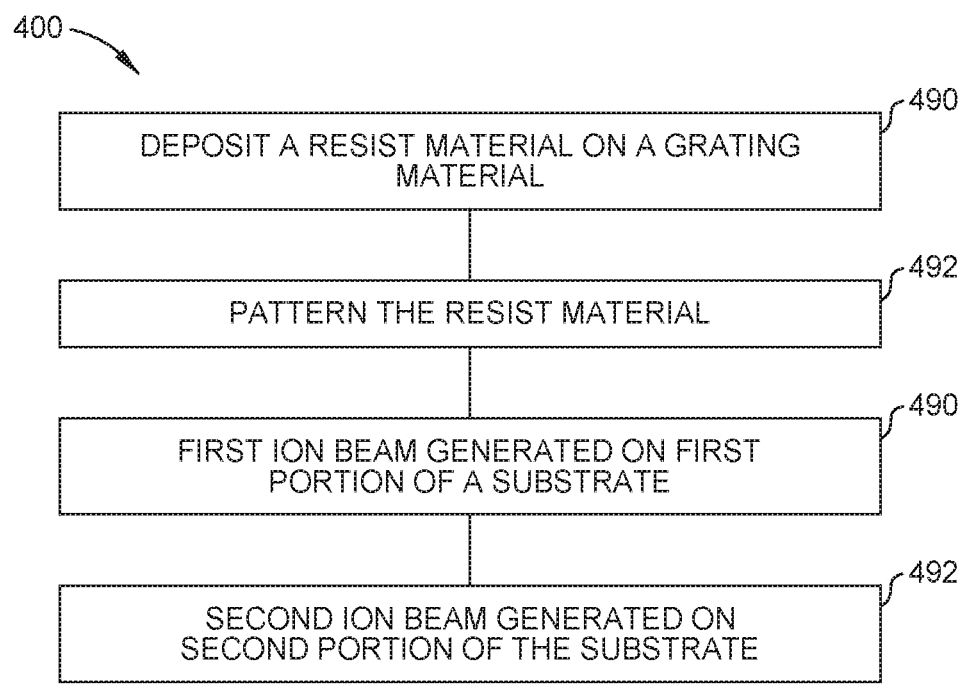
FIG. 4A is a flow diagram of method operations for forming gratings, according to one embodiment.

FIG. 4A is a flow diagram of method 400 operations for forming gratings, according to one embodiment. Although the method 400 operations are described in conjunction with FIGS. 4A-4C, persons skilled in the art will understand that any system configured to perform the method operations, in any order, falls within the scope of the embodiments described herein.

Figure 4B:
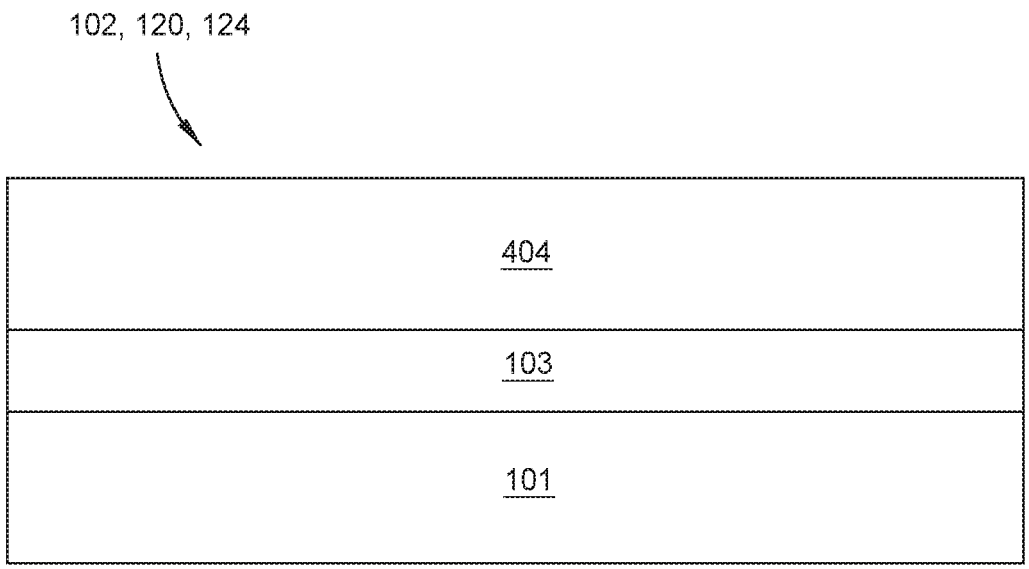
FIG. 4B illustrates a substrate with a resist material disposed over a grating material, according to one embodiment.

The method 400 begins at operation 490, where a resist material is deposited on a grating material. FIG. 4B illustrates the substrate 101 with a resist material 404 disposed over the grating material 103, according to one embodiment. In some embodiments, the portion of the material illustrated in FIGS. 4B-4E is the first device area 102, the second device area 120, or the third device area 124 described above. The resist material 404 can be any resist material used in the art, such as, but not limited to, a photoresist, a liquid resist, and the like. In one embodiment, which can be combined with other embodiments described herein, a patterned hardmask 213 is disposed over the grating material 103 and under the resist material 404.

Figure 4C:
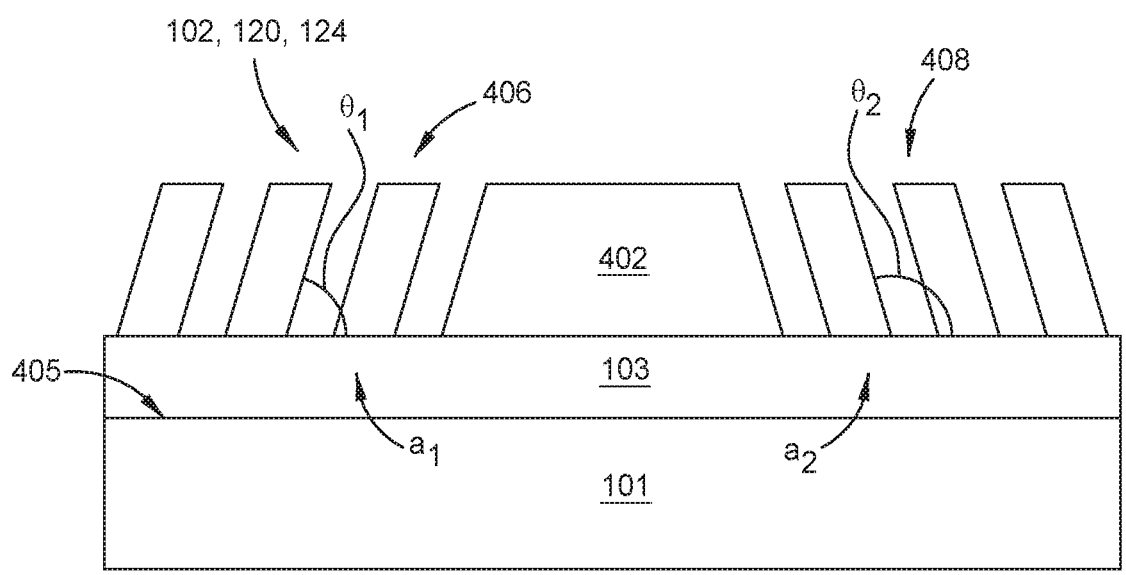
FIG. 4C illustrates a substrate with a resist layer disposed over a grating material, according to one embodiment.

At operation 492, the resist material is patterned to form a resist layer. FIG. 4C illustrates the substrate 101 with a resist layer 402 disposed over the grating material 103, according to one embodiment. Operation 492 includes forming the resist material 404 into a resist layer 402 having a first portion of pattern features 406 having a first slant angle $\vartheta_1$, and a second portion of pattern features 408 having a second slant angle $\vartheta_2$. The first portion of pattern features 406 is formed over the first region $a_1$, and the second portion of pattern features 408 is formed over the second region $a_2$, according to some embodiments.

In some embodiments, which can be combined with other embodiments described herein, the resist layer 402 is formed by a nanoimprint lithography process by pressing a mold against the resist material 404. Heat is applied to the resist material 404 during operation 492, according to one embodiment. Ultraviolet light (UV) is applied to the resist material 404 during operation 492, according to one embodiment. In some embodiments, the resist material 404 includes a photoresist, and the resist layer 402 is formed by a photolithography process.

Figure 4D:
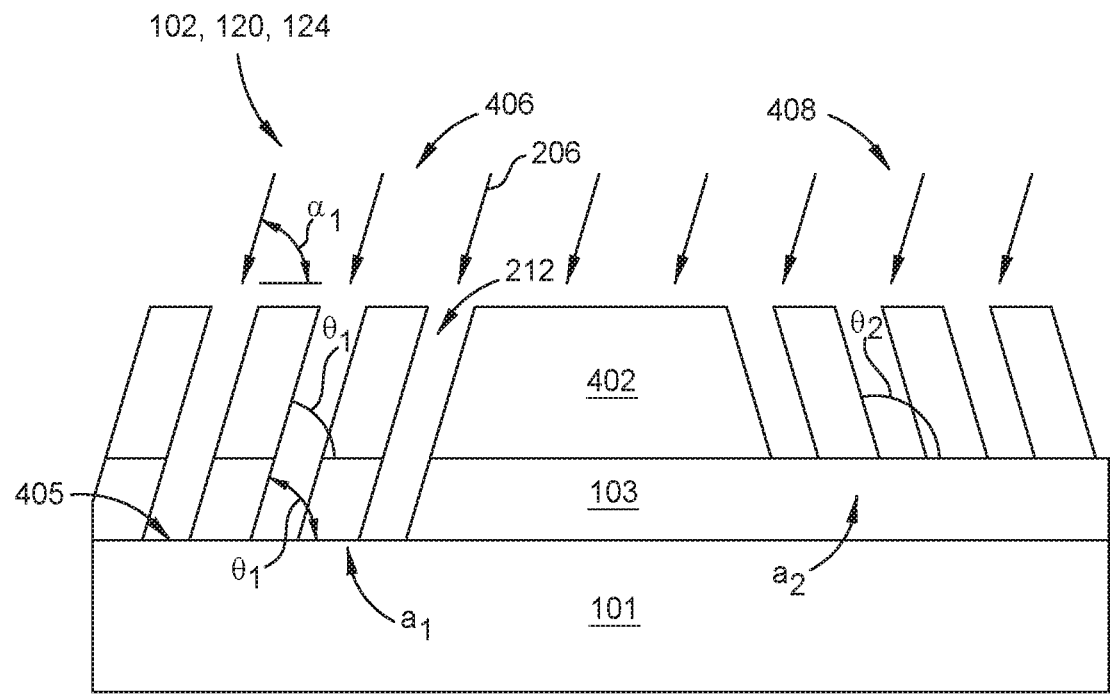
FIGS. 4D-4E illustrates a substrate exposed to an ion beam, according to one embodiment.

At operation 490, a first region of a substrate is exposed to an ion beam with a first ion beam profile. FIG. 4D illustrates the substrate 101 exposed to the ion beam 206, according to one embodiment. The first portion of pattern features 406 of the resist layer 402 has a slant angle $\vartheta_1$ that is defined between a first direction parallel to a surface 405 of the substrate 101 and a second direction perpendicular to the surface 405. The slant angle $\vartheta_1$ is about equal to a first beam angle $\alpha_1$ of the ion beam, such that the ion beam etches the first plurality of gratings 212 having the slant angle $\vartheta_1$ in the grating material 103 on the first region $a_1$ of the substrate 101. However, the second portion of pattern features 408 of the resist layer 402 have a second slant angle $\vartheta_2$ such that the ion beam 206 having the first beam angle $\alpha_1$ does not etch the grating material 103 on the second region $a_2$ of the substrate 101. Thus, only the first region $a_1$ of the grating material 103 is removed, and only the first plurality of gratings 212 is formed. The slant angle $\vartheta_1$ can vary from about 5° to about 175°.

Figure 4E:
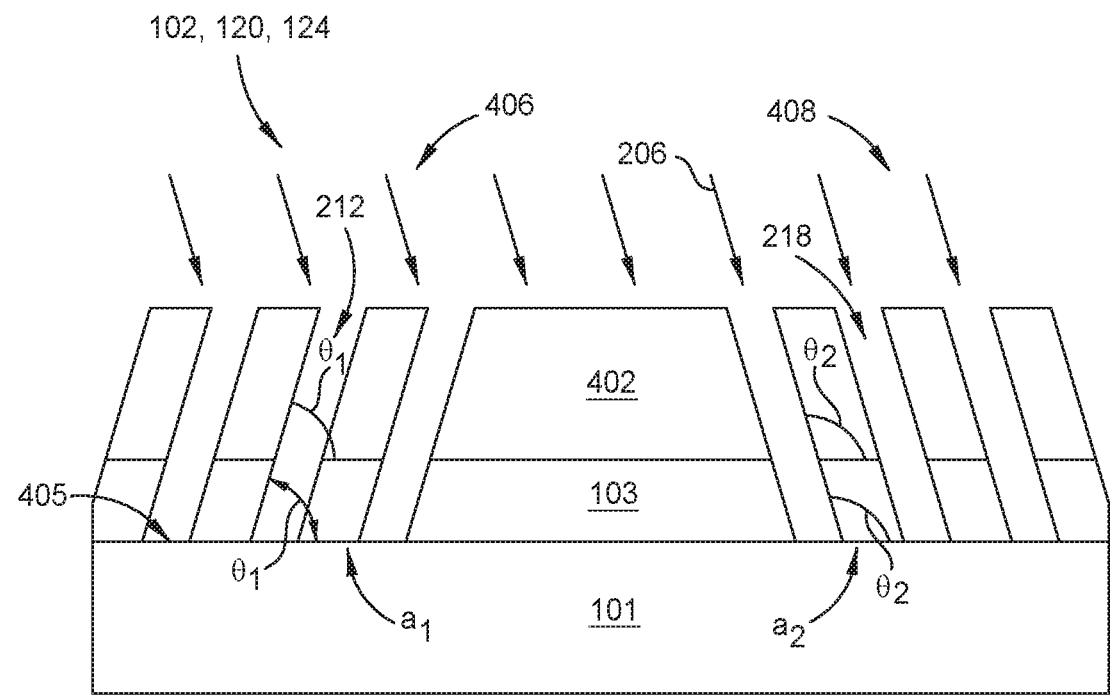

At operation 492, a second region of a substrate is exposed to an ion beam with a second ion beam profile. The first and second ion beam profiles can be the same or different. In some embodiments, at least one of the first ion beam profile and the second ion beam profile is not uniform. FIG. 4E illustrates the substrate 101 exposed to the ion beam 206, according to one embodiment. The second portion of pattern features 408 of the resist layer 402 has a slant angle $\vartheta_2$ that is defined between the first direction parallel to a surface 405 of the substrate 101 and the second direction perpendicular to the surface 405. The first portion of pattern features 406 of the resist layer 402 have the first slant angle $\vartheta_1$, such that the ion beam 206 having a second beam angle $\alpha_2$ does not etch the grating material 103 on the first region $a_1$ of the substrate 101. However, the second portion of pattern features 408 of the resist layer 402 have the second slant angle $\vartheta_2$ such that the ion beam 206 having the second beam angle $\alpha_2$ etches the grating material 103 on the second region $a_2$ of the substrate 101. Thus, only the first region $a_2$ of the grating material 103 is removed, and only the second plurality of gratings 218 is formed. The slant angle $\vartheta_1$ can vary from about 5° to about 175°. The first slant angle $\vartheta_1$ is from about 5° to about 85°, and the second slant angle $\vartheta_2$ is from about 95° to about 175°, according to one embodiment.

One or more waveguide combiners 128 (FIG. 1B) can be formed from the methods 100, 200, 300, 400. The waveguide combiner 128 includes one of the first devices 104 having the first plurality of gratings, one of the second devices 122 having the plurality of gratings, and one of the third devices 126 having the third plurality of gratings, according to one embodiment.

As described above, methods of forming patterns are provided. The method includes depositing a resist material on a grating material disposed over a substrate, patterning the resist material into a resist layer, projecting a first ion beam to the first device area to form a first plurality of gratings, and projecting a second ion beam to the second device area to form a second plurality of gratings.

Using a patterned resist layer allows for projecting an ion beam over a large area, which is often easier than focusing the ion beam in a specific area. The angles of elements the patterned resist facilitates ion etching for angles of the ion beam that are similar to angles of the elements of the patterned resist layer. Other regions are less patterned, due to the mismatch of the angles of the ion beam to the angles of the elements of the patterned resist layer.

While the foregoing is directed to examples of the present disclosure, other and further examples of the disclosure may be devised without departing from the basic scope thereof, and the scope thereof is determined by the claims that follow.

What is claimed is:

1. A method, comprising:
   forming a patterned resist, the forming of the patterned resist comprising:
     depositing a resist material on a layer of grating material disposed over a substrate, the resist material having a first device area and a second device area;
     patterning the resist material into a patterned resist layer, the patterned resist layer having:
       a plurality of first pattern features disposed over the first device area, the plurality of first pattern features exposing first portions of the layer of grating material of the first device area, the first pattern features having a first slant angle, the first slant angle configured to allow beams between the first pattern features of a first beam angle to contact the layer of grating material of the first device area; and
       a plurality of second pattern features disposed over the second device area, the plurality of second pattern features exposing portions of the layer of grating material of the second device area, the second pattern features having a second slant angle configured to allow beams between the second pattern features of a second beam angle to contact the layer of grating material of the second device area, the second slant angles of each of the second pattern features is different from the first slant angles of each of the first pattern features;
   projecting one or more first beams at the first beam angle to the substrate, the first beams forming a plurality of first gratings in the first portions of the layer of grating material of the first device area that is exposed by the first pattern features, the first gratings having a first grating angle and the second pattern features blocking the first beams from contacting exposed second portions of the layer of grating material; and
   projecting one or more second beams at the second beam angle to the substrate, the second beam forming a plurality of second gratings in the second portions of the layer of grating material of the second device area that is exposed by the second pattern features, the second gratings having a second grating angle different than the first grating angle and the second pattern features blocking the second beams from contacting exposed first portions of the layer of grating material.

2. The method of claim 1, wherein a first depth of the plurality of first gratings has a first depth profile, and a second depth of the plurality of second gratings has a second depth profile different than the first depth profile.

3. The method of claim 2, wherein at least one of the first depth profile or the second depth profile is a stepped profile.

4. The method of claim 2, wherein at least one of the first depth profile or the second depth profile is a sloped profile.

5. The method of claim 1, wherein the resist material comprises a photoresist material or imprint material.

6. The method of claim 1, wherein:
the first grating angle of the first gratings is from about 5° to about 85°; and
the second grating angle of the second gratings is from about 95° to about 175°.

7. The method of claim 1, wherein the first beams and the second beams comprise ions.

8. A method, comprising:
forming a patterned resist, the forming of the patterned resist comprising:
depositing a resist material over a patterned hardmask and over exposed portions of a layer of grating material exposed by the patterned hardmask, the layer of grating material disposed over a substrate, the resist material having a first device area and a second device area;
patterning the resist material into a patterned resist layer, the patterned resist layer having:
a plurality of first pattern features disposed over the first device area, the plurality of first pattern features exposing first portions of the layer of grating material of the first device area, the first pattern features having a first slant angle, the first slant angle configured to allow beams between the first pattern features of a first beam angle to contact the layer of grating material of the first device area; and
a plurality of second pattern features disposed over the second device area, the plurality of second pattern features exposing portions of the layer of grating material of the second device area, the second pattern features having a second slant angle configured to allow beams between the second pattern features of a second beam angle to contact the layer of grating material of the second device area, the second slant angles of each of the second pattern features is different from the first slant angles of each of the first pattern features;
projecting one or more first beams at the first beam angle to the substrate, the first beams forming a plurality of first gratings in the first portions of the layer of grating material of the first device area that is exposed by the first pattern features, the first gratings having a first grating angle and the second pattern features blocking the first beams from contacting exposed second portions of the layer of grating material; and
projecting one or more second beams at the second beam angle to the substrate, the second beam forming a plurality of second gratings in the second portions of the layer of grating material of the second device area that is exposed by the second pattern features, the second gratings having a second grating angle different than the first grating angle and the second pattern features blocking the second beams from contacting exposed first portions of the layer of grating material.

9. The method of claim 8, wherein a first depth of the plurality of first gratings has a first depth profile, and a second depth of the plurality of second gratings has a second depth profile different than the first depth profile.

10. The method of claim 9, wherein at least one of the first depth profile or the second depth profile is a stepped profile.

11. The method of claim 9, wherein at least one of the first depth profile or the second depth profile is a sloped profile.

12. The method of claim 8, wherein the patterned resist layer is cured by exposure to ultraviolet (UV) light.

13. The method of claim 8, wherein the patterned resist layer is cured by heating the resist material.

14. A method, comprising:
forming a patterned resist, the forming of the patterned resist comprising:
depositing a resist material on a layer of grating material disposed over a substrate, the resist material having a first device area and a second device area;
imprinting the resist material into a patterned resist layer, the patterned resist layer having;
a plurality of first pattern features disposed over the first device area, the plurality of first pattern features exposing first portions of the layer of grating material of the first device area, the first pattern features having a first slant angle, the first slant angle configured to allow beams between the first pattern features of a first beam angle to contact the layer of grating material of the first device area; and
a plurality of second pattern features disposed over the second device area, the plurality of second pattern features exposing portions of the layer of grating material of the second device area, the second pattern features having a second slant angle configured to allow beams between the second pattern features of a second beam angle to contact the layer of grating material of the second device area, the second slant angles of each of the second pattern features is different from the first slant angles of each of the first pattern features;
projecting one or more first beams at the first beam angle to the substrate, the first beams forming a plurality of first gratings in the first portions of the layer of grating material of the first device area that is exposed by the first pattern features, the first gratings having a first grating angle and the second pattern features blocking the first beams from contacting exposed second portions of the layer of grating material; and
projecting one or more second beams at the second beam angle to the substrate, the second beam forming a plurality of second gratings in the second portions of the layer of grating material of the second device area that is exposed by the second pattern features, the second gratings having a second grating angle different than the first grating angle and the second pattern features blocking the second beams from contacting exposed first portions of the layer of grating material.

15. The method of claim 14, wherein a first depth of the plurality of first gratings has a first depth profile, and a second depth of the plurality of second gratings has a second depth profile different than the first depth profile.

16. The method of claim 15, wherein at least one of the first depth profile or the second depth profile is a stepped profile.

17. The method of claim 15, wherein at least one of the first depth profile or the second depth profile is a sloped profile.

18. The method of claim 14, wherein the resist material comprises a photoresist material or imprint material.

19. The method of claim 14, wherein:
the first grating angle of the first gratings is from about 5° to about 85°; and
the second grating angle of the second gratings is from about 95° to about 175°.

20. The method of claim 14, wherein the first beams and the second beams comprise ions.

* * * * *